US009611143B2

(12) United States Patent
Ho et al.

(10) Patent No.: US 9,611,143 B2
(45) Date of Patent: Apr. 4, 2017

(54) METHOD FOR FORMING CHIP PACKAGE

(71) Applicant: XINTEC INC., Taoyuan (TW)

(72) Inventors: Yen-Shih Ho, Kaohsiung (TW);
Tsang-Yu Liu, Zhubei (TW);
Chia-Sheng Lin, Taoyuan (TW);
Yi-Ming Chang, Taoyuan (TW)

(73) Assignee: XINTEC INC., Taoyuan (TW)

( * ) Notice: Subject to any disclaimer, the term of this patent is extended or adjusted under 35 U.S.C. 154(b) by 0 days.

(21) Appl. No.: 14/676,738

(22) Filed: Apr. 1, 2015

(65) Prior Publication Data

US 2015/0284244 A1 Oct. 8, 2015

(30) Foreign Application Priority Data

Apr. 3, 2014 (TW) .............. 103112450 A

(51) Int. Cl.
*H01L 21/00* (2006.01)
*B81C 1/00* (2006.01)
*H01L 21/78* (2006.01)
*H01L 23/00* (2006.01)
*H01L 21/683* (2006.01)
*H01L 27/146* (2006.01)
*B81B 7/00* (2006.01)
*H01L 23/544* (2006.01)

(52) U.S. Cl.
CPC .......... *B81C 1/00896* (2013.01); *B81B 7/007* (2013.01); *H01L 21/6835* (2013.01); *H01L 21/6836* (2013.01); *H01L 21/78* (2013.01); *H01L 24/11* (2013.01); *H01L 24/43* (2013.01); *H01L 24/83* (2013.01); *H01L 27/14618* (2013.01); *H01L 27/14687* (2013.01); *B81B 2207/096* (2013.01); *H01L 23/544* (2013.01); *H01L 2221/68327* (2013.01); *H01L 2223/54426* (2013.01); *H01L 2224/0231* (2013.01); *H01L 2224/8385* (2013.01); *H01L 2924/00014* (2013.01); *H01L 2924/05032* (2013.01); *H01L 2924/05432* (2013.01)

(58) Field of Classification Search
CPC . H01L 21/78; H01L 21/6836; H01L 21/6835; H01L 24/83; H01L 24/11; H01L 24/43; H01L 27/1468; H01L 27/14687
See application file for complete search history.

(56) References Cited

U.S. PATENT DOCUMENTS

| 7,696,008 | B2 * | 4/2010 | Chen | ..................... H01L 33/483 257/621 |
| 8,710,680 | B2 * | 4/2014 | Chang | .................. H01L 23/481 257/784 |
| 2007/0158673 | A1 | 7/2007 | Chen | |

FOREIGN PATENT DOCUMENTS

| CN | 102034796 | 4/2011 |
| TW | 200727423 | 7/2007 |
| TW | 201133725 | 10/2011 |
| TW | 201327732 | 7/2013 |

* cited by examiner

*Primary Examiner* — Richard Booth
(74) *Attorney, Agent, or Firm* — Liu & Liu

(57) ABSTRACT

A method for forming a chip package is provided. The method includes providing a substrate and a capping layer, wherein the substrate has a sensing device therein adjacent to a surface of the substrate. The capping layer is attached to the surface of the substrate by an adhesive layer, wherein the adhesive layer covers the sensing device. A dicing process is performed on the substrate, the adhesive layer, and the capping layer along a direction to form individual chip packages.

20 Claims, 4 Drawing Sheets

METHOD FOR FORMING CHIP PACKAGE

CROSS REFERENCE TO RELATED APPLICATIONS

The Application is based on, and claims priority of Taiwan Patent Application No. 103112450, filed on Apr. 3, 2014, the entirety of which is hereby incorporated by reference herein in their entirety.

BACKGROUND OF THE INVENTION

Field of the Invention

The invention relates to chip packaging technology, and in particular to methods for forming a chip package.

Description of the Related Art

The chip packaging process is an important step in the fabrication of an electronic product. Chip packages not only protect the chips therein from outer environmental contaminants, but they also provide electrical connection paths between electronic elements inside and those outside of the chip packages.

Sensing devices of the chip packages with sensing capabilities can easily be contaminated or damaged during conventional fabrication processes and when the sensing functions of the chip packages are used. As a result, the performance of the sensing devices is adversely affected, thereby reducing the reliability and quality of the chip packages.

Thus, there exists a need in the art for development of a method for forming a chip package capable of mitigating or eliminating the aforementioned problems.

BRIEF SUMMARY OF THE INVENTION

An embodiment of the invention provides a method for forming a chip package. The method comprises providing a substrate and a capping layer. The substrate has a sensing device therein adjacent to a first surface of the substrate. The capping layer is attached to the first surface of the substrate by an adhesive layer, and the adhesive layer covers the sensing device. A dicing process is performed on the substrate, the adhesive layer, and the capping layer along a direction to form individual chip packages.

A detailed description is given in the following embodiments with reference to the accompanying drawings.

BRIEF DESCRIPTION OF THE DRAWINGS

The present invention can be more fully understood by reading the subsequent detailed description and examples with references made to the accompanying drawings, wherein.

DETAILED DESCRIPTION OF THE INVENTION

The making and using of the embodiments of the present disclosure are discussed in detail below. However, it should be noted that the embodiments provide many applicable inventive concepts that can be embodied in a variety of specific methods. The specific embodiments discussed are merely illustrative of specific methods to make and use the embodiments, and do not limit the scope of the disclosure. The disclosed contents of the present disclosure include all the embodiments derived from claims of the present disclosure by those skilled in the art. In addition, the present disclosure may repeat reference numbers and/or letters in the various embodiments. This repetition is for the purpose of simplicity and clarity, and does not imply any relationship between the different embodiments and/or configurations discussed. Furthermore, when a first layer is referred to as being on or overlying a second layer, the first layer may be in direct contact with the second layer, or spaced apart from the second layer by one or more material layers.

A chip package according to an embodiment of the present invention may be used to package micro-electro-mechanical system chips. However, embodiments of the invention are not limited thereto. For example, the chip package of the embodiments of the invention may be implemented to package active or passive elements or electronic components of integrated circuits, such as digital or analog circuits. For example, the chip package may be related to optoelectronic devices, micro-electro-mechanical systems (MEMS), biometric devices, microfluidic systems, and physical sensors measuring changes to physical quantities such as heat, light, capacitance, pressure, and so on. In particular, a wafer-level packaging (WSP) process may optionally be used to package semiconductor chips, such as image-sensor elements, light-emitting diodes (LEDs), solar cells, RF circuits, accelerators, gyroscopes, fingerprint-recognition devices, micro actuators, surface acoustic wave devices, pressure sensors, ink printer heads, and so on.

The above-mentioned wafer-level packaging process mainly means that after the packaging step is accomplished during the wafer stage, the wafer with chips is cut to obtain individual packages. However, in a specific embodiment, separated semiconductor chips may be redistributed on a carrier wafer and then packaged, which may also be referred to as a wafer-level packaging process. In addition, the above-mentioned wafer-level packaging process may also be adapted to form a chip package having multi-layer integrated circuit devices by stacking a plurality of wafers having integrated circuits.

An exemplary embodiment of a method for forming a chip package according to the invention is illustrated with FIGS. 1A to 1E, wherein FIGS. 1A to 1E are cross-sectional views of an exemplary embodiment of a method for forming a chip package according to the invention.

Figure 1A:
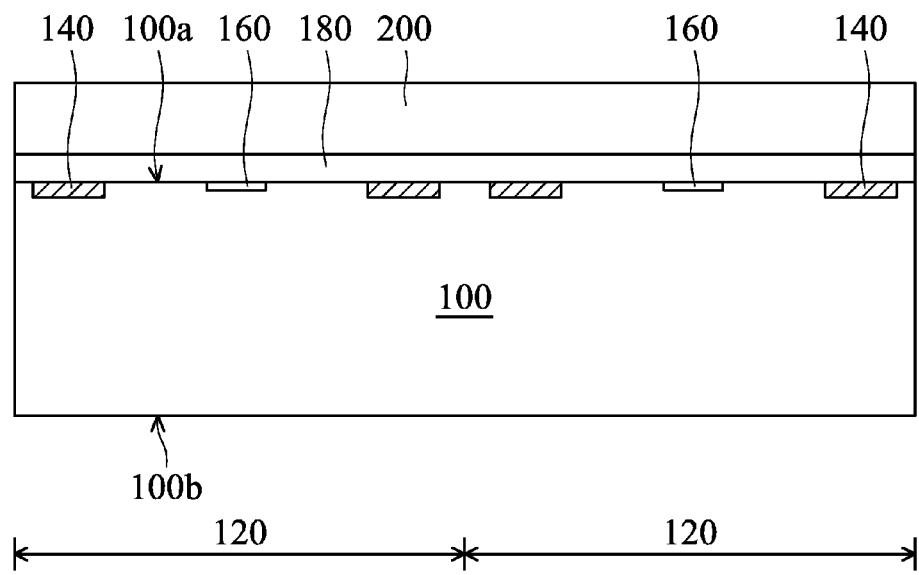
FIGS. 1A to 1E are cross-sectional views of an exemplary embodiment of a method for forming a chip package according to the invention.

Referring to FIG. 1A, a substrate 100 is provided. The substrate 100 has a first surface 100a and a second surface 100b opposite thereto, and comprises a plurality of chip regions 120. In one embodiment, the substrate 100 may be a silicon substrate or another semiconductor substrate. In another embodiment, the substrate 100 is a silicon wafer so as to facilitate the wafer-level packaging process.

In the embodiment, the substrate 100 in each chip region 120 has a plurality of conducting pads, which may be adjacent to the first surface 100a. To simplify the diagram, only two adjacent chip regions 120 and two conducting pads 140 within the substrate 100 in each chip region 120 are depicted herein. In one embodiment, the conducting pad 140 may be a single conducting layer or comprise multiple conducting layers. Only a single conducting layer is depicted herein as an example.

In the embodiment, the substrate 100 in each chip region 120 has a sensing device 160, which may be adjacent to the first surface 100a of the substrate 100. In one embodiment, the sensing device 160 may comprise an image-sensing element. In another embodiment, the sensing device 160 is configured to sense biometrics, and may comprise a fingerprint-recognition element. In yet another embodiment, the sensing device 160 is configured to sense environmental characteristics, and may comprise a temperature-sensing element, a humidity-sensing element, a pressure-sensing element, or another suitable sensing element. In one embodiment, the sensing device 160 may be electrically connected to the conducting pads 140 through an interconnection structure (not shown).

Next, a capping layer 200 may be attached to the first surface 100a of the substrate 100 by an adhesive layer 180. In the embodiment, the adhesive layer 180 covers the sensing device 160, and there is no gap or void between the adhesive layer 180 and the sensing device 160 and. In one embodiment, there is only the adhesive layer 180, without a spacer layer (or dam), located between the capping layer 200 and the sensing device 160. In one embodiment, the adhesive layer 180 may comprise epoxy resin, inorganic materials (such as silicon oxide, silicon nitride, silicon oxynitride, metal oxide or a combination thereof), organic polymer materials (such as polyimide, butylcyclobutene, parylene, polynaphthalenes, fluorocarbons or acrylates) or other suitable adhesive materials. Furthermore, the capping layer 200 may comprise glass, aluminum nitride (AlN), tape, sapphire or another suitable protective material.

Figure 1B:
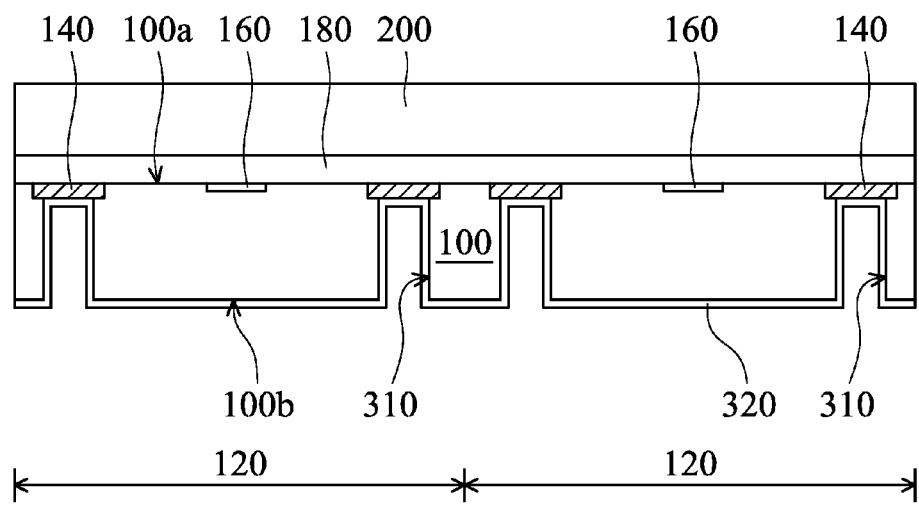

Referring to FIG. 1B, a thinning process (such as an etching process, a milling process, a mechanical grinding process, or a chemical-mechanical polishing process) is performed on the second surface 100b of the substrate 100 by using the capping layer 200 as a support substrate. As a result, the thickness of the substrate 100 is reduced.

Next, a plurality of openings 310 is formed in the substrate 100 in each chip region 120 by lithography and etching processes (the etching process may comprise a dry etching process, a wet etching process, a plasma etching process, a reactive ion etching process or another suitable process). The first openings 310 extend from the second surface 100b of the substrate 100 toward the first surface 100a, and expose respective conducting pads 140 adjacent to the first surface 100a.

Next, an insulating layer 320 is conformally formed on the second surface 100b of the substrate 100 by a deposition process (such as a coating process, a physical vapor deposition process, a chemical vapor deposition process or another suitable process). The insulating layer 320 extends into the first openings 310 in the substrate 100. In the embodiment, the insulating layer 320 may comprise epoxy resin, inorganic materials (such as silicon oxide, silicon nitride, silicon oxynitride, metal oxide or a combination thereof), organic polymer materials (such as polyimide, butylcyclobutene, parylene, polynaphthalenes, fluorocarbons or acrylates) or another suitable insulating material.

Figure 1C:
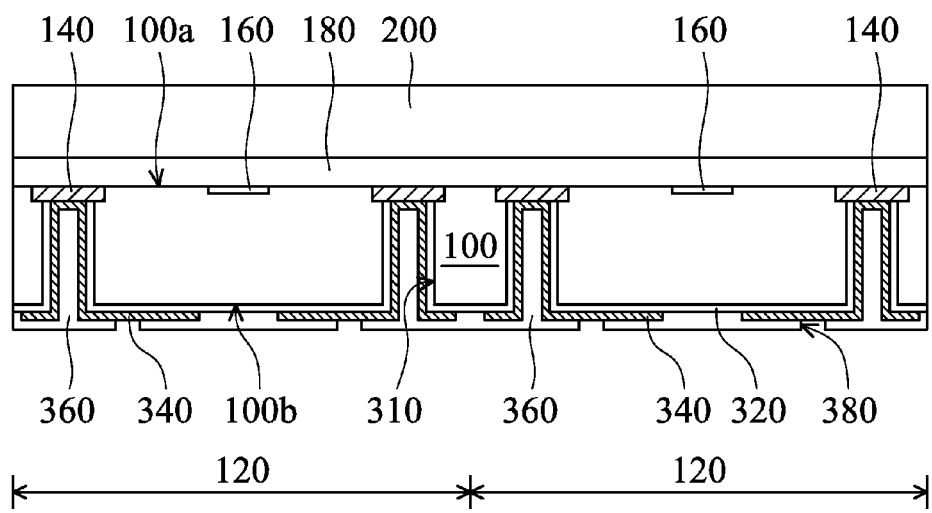

Referring to FIG. 1C, the insulating layer 320 on the bottoms of the first openings 310 is removed by lithography and etching processes (such as a dry etching process, a wet etching process, a plasma etching process, a reactive ion etching process or another suitable process) so as to expose the surfaces of the conducting pads 140. A patterned redistribution layer 340 is then formed on the insulating layer 320 by a deposition process (such as a coating process, a physical vapor deposition process, a chemical vapor deposition process, a plating process, an electroless plating process or another suitable process), a lithography process and an etching process.

The redistribution layer 340 conformally extends to the bottoms of the first openings 310 in the substrate 100, and directly contacts the exposed conducting pads 140 to electrically connect to the conducting pads 140. The redistribution layer 340 is electrically isolated from the substrate 100 by the insulating layer 320. Thus, the redistribution layer 340 in the first opening 310 is also referred to as a through silicon via (TSV). In one embodiment, the redistribution layer 340 may comprise copper, aluminum, gold, platinum, nickel, tin, a combination thereof, a conductive polymer material, a conductive ceramic material (such as indium tin oxide or indium zinc oxide) or another suitable conductive material.

In another embodiment, the first openings 310 in the substrate 100 may expose sidewalls of the conducting pads 140. The redistribution layer 340 is electrically isolated from the substrate 100 by the insulating layer 320 and directly contacts the exposed sidewall of the respective conducting pad 140, such that the redistribution layer 340 electrically connected to the respective conducting pad 140 is referred to as a T-contact. In yet another embodiment, the first openings 310 in the substrate 100 may at least penetrate through the conducting pads 140, and the redistribution layer 340 may directly contact the inner of the respective conducting pad 140, such that the redistribution layer 340 electrically connected to the respective conducting pad 140 is referred to as a ring-contact.

Next, a passivation layer 360 is formed on the redistribution layer 340 by a deposition process. The passivation layer 360 is filled into the first openings 310 in the substrate 100 to cover the redistribution layer 340. Subsequently, a plurality of second openings 380 is formed in the passivation layer 360 in each chip region 120 by lithography and etching processes to expose portions of the redistribution layer 340 located on the second surface 100b of the substrate 100. In the embodiment, the passivation layer 360 may comprise epoxy resin, solder mask, inorganic materials (such as silicon oxide, silicon nitride, silicon oxynitride, metal oxide or a combination thereof), organic polymer materials (such as polyimide, butylcyclobutene, parylene, polynaphthalenes, fluorocarbons or acrylates) or other suitable insulating materials. In another embodiment, the passivation layer 360 may comprise a photoresist material, and the second openings 380 may be formed in the passivation layer 360 by exposure and developing processes.

Figure 1D:
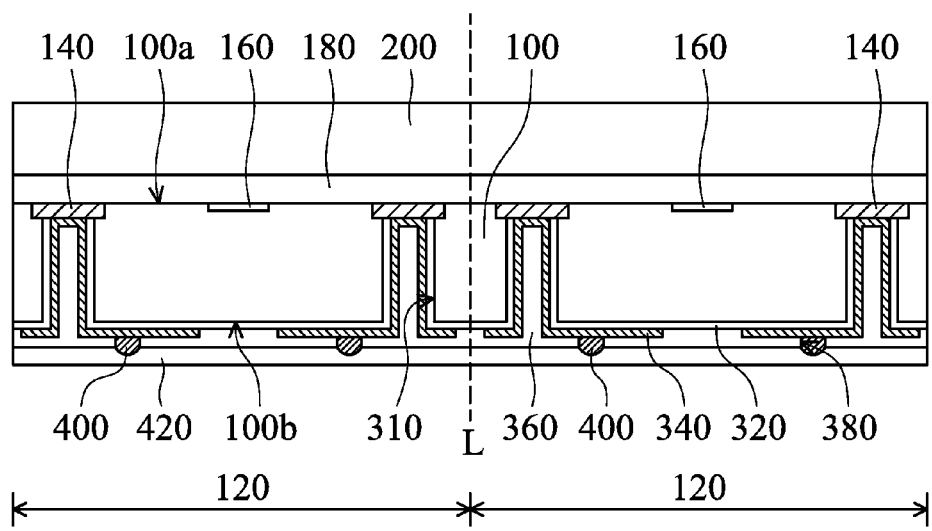

Referring to FIG. 1D, conducting structures (such as solder balls, bumps or conductive pillars) 400 are formed in the second openings 380 of the passivation layer 360 to directly contact the exposed redistribution layer 340 and electrically connect the patterned redistribution layer 340. For example, solder may be formed in the second openings 380 of the passivation layer 360 by a plating process, a screen printing process or another suitable process, and then a reflow process is performed to form the conducting structures 400. In addition, although not shown in the figures, the conducting structures 400 may be arranged in an array on the second surface 100b of the substrate 100 as viewed from a top-view perspective. In the embodiment, the conducting structures 400 may comprise tin, lead, copper, gold, nickel, a combination thereof, or another suitable conductive material.

Figure 1E:
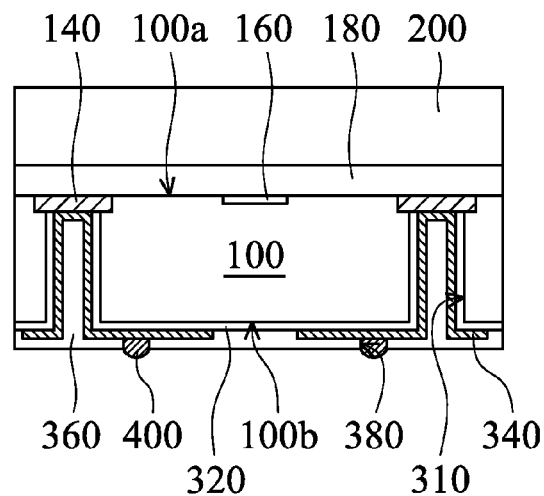

Next, a protection layer 420 (such as a tape) is formed on the passivation layer 360 and the conducting structures 400 to provide a flat surface and protect the conducting structures 400. Subsequently, a dicing process is performed on the substrate 100, the adhesive layer 180, and the capping layer 200 by using the protection layer 420 as a support. The dicing process is performed along scribe lines L between the adjacent chip regions 120 and along a direction from the capping layer 200 toward the substrate 100. After the dicing process, the protection layer 420 is removed and a plurality of individual chip packages is formed, as shown in FIG. 1E. In the above-mentioned embodiments, the capping layer 200 is formed of a transparent material (such as glass, sapphire, or another suitable transparent material), and that facilitates performing the dicing process along the direction from the capping layer 200 toward the substrate 100. As a result, the accuracy of alignment is enhanced.

Figure 2:
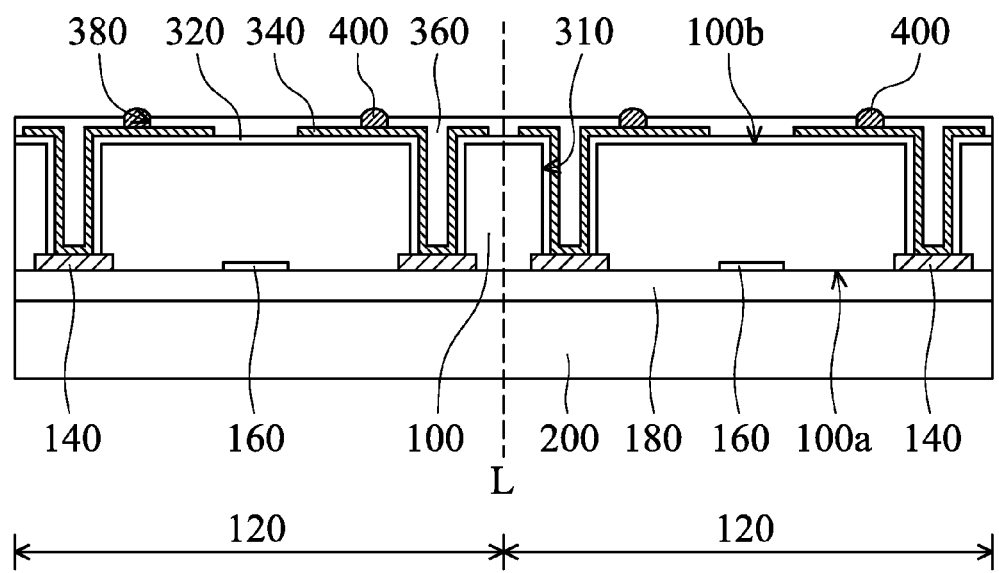
FIG. 2 is a cross-sectional view of another exemplary embodiment of a method for forming a chip package according to the invention.

In another embodiment, as shown in FIG. 2, the above-mentioned dicing process may be performed along a direction from the substrate 100 toward the capping layer 200 and by directly using the capping layer 200 as a support without additionally forming a protection layer for protecting the conducting structures 400 (such as the protection layer 420 shown in FIG. 1D). Furthermore, when the capping layer 200 is formed of a non-transparent material (such as aluminum nitride, tape or another suitable non-transparent material), alignment marks may be previously formed above the second surface 100b of the substrate 100 to improve the accuracy of the dicing process. For example, during the step of forming the second openings 380 in the passivation layer 360, holes (not shown) can be simultaneously formed in the passivation layer 360 as the alignment marks so as to facilitate performing the subsequent dicing process along the direction from the substrate 100 toward the capping layer 200.

In the embodiment, a circuit board (not shown) may be further provided on the second surface 100b of the substrate 100 of an independent chip package. The redistribution layer 340 and the conducting pads 140 can be electrically connected to contact pads (not shown) of the circuit board by the conducting structures 400.

Figure 3:
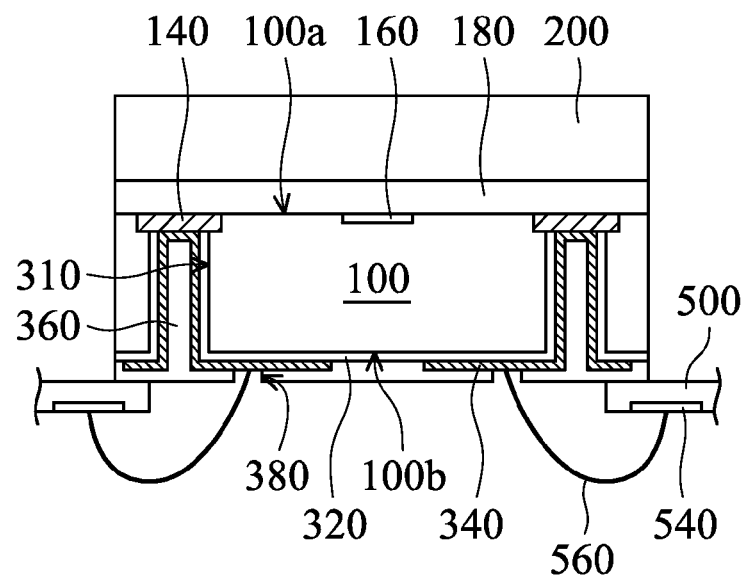
FIGS. 3 and 4 are cross-sectional views of various exemplary embodiments of a chip package according to the invention.
Figure 4:
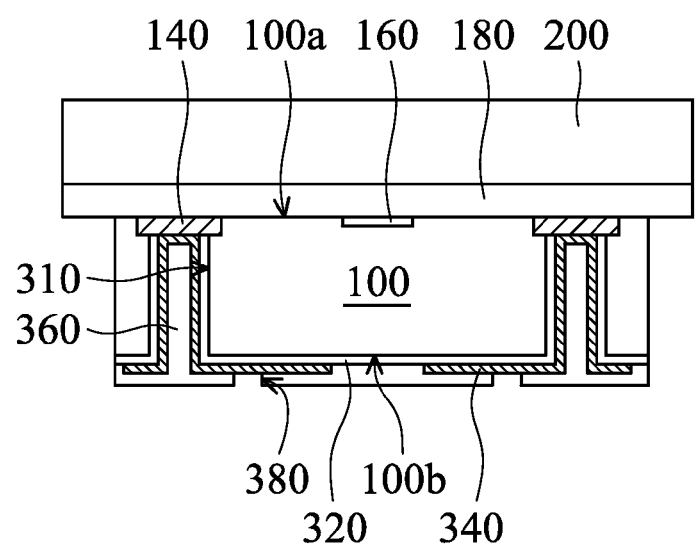

Referring to FIGS. 3 and 4, cross-sectional views of various exemplary embodiments of a chip package according to the invention are illustrated, wherein elements in FIGS. 3 and 4 that are the same as those in FIG. 1E are labeled with the same reference numbers as in FIG. 1E and are not described again for brevity. The method for forming the chip package shown in FIG. 3 is similar to that shown in FIG. 1E. One difference therebetween is that the method for forming the chip package shown in FIG. 3 does not comprise forming conducting structures (such as the conducting structures 400 shown in FIG. 1E) in the second openings 380 of the passivation layer 360. After performing the dicing process, portions of the redistribution layer 340 on the second surface 100b of the substrate 100 are still exposed. Moreover, another difference is that the method for forming the chip package shown in FIG. 3 further comprise providing a circuit board (such as a flexible printed circuit board, FPC) 500 on the second surface 100b of the substrate 100 after performing the dicing process. A wire bonding process is then performed to form bonding wires 560. The bonding wires 560 are formed on the exposed portions of the redistribution layer 340 and extend to respective contact pads 540 in the circuit board 500. Therefore, the conducting pads 140 in the substrate 100 are electrically connected to the respective contact pads 540 in the circuit board 500. In addition, although the bonding wires 560 shown in FIG. 3 extend from the second surface 100b of the substrate 100 through two opposite sides of the sensing device 160 onto the circuit board 500, it is realized that the bonding wires 560 may extend through the same side of the sensing device 160 onto the circuit board 500 or may extend through two adjacent sides of the sensing device 160 onto the circuit board 500.

Furthermore, the method for forming the chip package shown in FIG. 4 is similar to that shown in FIG. 1E. The difference therebetween is that the method for forming the chip package shown in FIG. 4 further comprises simultaneously removing a portion of the sidewalls of the substrate 100 by the same etching process during the step of forming the first openings 310. As a result, portions of the adhesive layer 180 are exposed, such that the chip package has a stepped sidewall.

In other embodiments, the embodiment of a method for forming a chip package shown in FIG. 3 may be combined with that shown in FIG. 4. For example, before the independent chip packages are formed, the second openings 380 of the passivation layer 360 in the chip package shown in FIG. 4 do not comprise the conducting structures 400 formed therein. After the independent chip packages are formed, portions of the redistribution layer 340 on the second surface 100b of the substrate 100 are still exposed. Next, the circuit board 500 shown in FIG. 3 is further provided on the second surface 100b of the substrate 100 in the chip package shown in FIG. 4. The bonding wires 560 shown in FIG. 3 are formed on the exposed portions of the redistribution layer 340 and the respective contact pads 540 in the circuit board 500. Therefore, the conducting pads 140 in the substrate 100 are electrically connected to the respective contact pads 540 in the circuit board 500.

According to the above-mentioned embodiments, the capping layer 200 is attached onto the first surface 100a of the substrate 100 through the adhesive layer 180. The capping layer 200 and the adhesive layer 180 cover the sensing device 160 on the first surface 100a of the substrate 100 without any gap or void formed between the adhesive layer 180 and the sensing device 160. Accordingly, the sensing device can be protected during the fabrication processes of the chip package and when the sensing function of the chip package is used. The contamination or damage of the sensing device is prevented. As a result, the sensing performance of the sensing device is improved, thereby increasing the reliability and quality of the chip package.

Moreover, forming chip packages by the wafer-level packaging process can produce massive chip packages, thereby reducing the processing cost and time. In addition, using the through silicon vias, the ring-contacts or the T-contacts, rather than bonding wires and a lead frame, as the external electrical connection paths of the chip package can significantly reduce the processing cost and the size of the chip package further.

While the invention has been described by way of example and in terms of the preferred embodiments, it is to be understood that the invention is not limited to the disclosed embodiments. On the contrary, it is intended to cover various modifications and similar arrangements (as would be apparent to those skilled in the art). Therefore, the scope of the appended claims should be accorded the broadest interpretation so as to encompass all such modifications and similar arrangements.

What is claimed is:
1. A method for forming a chip package, comprising:
providing a substrate and a capping layer, wherein the substrate has a sensing device therein adjacent to a first surface of the substrate, and wherein the substrate has a conducting pad therein adjacent to the first surface;

attaching the capping layer to the first surface of the substrate by an adhesive layer, wherein the adhesive layer covers the sensing device;

partially removing the substrate to expose the conducting pad and the adhesive layer, wherein a first opening extends from a second surface of the substrate, which is opposite to the first surface, toward the first surface to partially expose the conducting pad; and performing a dicing process on the exposed adhesive layer, and the capping layer along a direction to form individual chip packages.

2. The method as claimed in claim 1, wherein there is no gap between the sensing device and the adhesive layer.

3. The method as claimed in claim 1, wherein the direction is from the capping layer toward the substrate.

4. The method as claimed in claim 1, wherein the direction is from the substrate toward the capping layer.

5. The method as claimed in claim 1, wherein the capping layer comprises glass, aluminum nitride, tape or sapphire.

6. The method as claimed in claim 1, further comprising forming a conducting structure on the second surface of the substrate, and forming a protection layer covering the conducting structure before performing the dicing process.

7. The method as claimed in claim 1, wherein before performing the dicing process, the method further comprises:

forming an insulating layer on the second surface and extending into the first opening;

forming a redistribution layer on the insulating layer and contacting the exposed conducting pad; and forming a passivation layer on the redistribution layer and exposing a portion of the redistribution layer on the second surface.

8. The method as claimed in claim 7, further comprising forming a conducting structure on the exposed portion of the redistribution layer.

9. The method as claimed in claim 7, further comprising forming a wire on the exposed portion of the redistribution layer after performing the dicing process.

10. The method as claimed in claim 7, wherein a portion of a sidewall of the substrate is removed to expose a portion of the adhesive layer.

11. The method as claimed in claim 7, further comprising thinning the substrate before performing the dicing process.

12. A method for forming a chip package, comprising:

providing a substrate, wherein the substrate has a sensing device and a conducting pad therein that are adjacent to a first surface of the substrate;

providing a capping layer, wherein the capping layer comprises a non-transparent material;

attaching the capping layer to the first surface of the substrate by an adhesive layer, wherein the adhesive layer covers the sensing device; and dicing the substrate, the adhesive layer and the capping layer along a direction from the substrate toward the capping layer so as to form individual chip packages.

13. The method as claimed in claim 12, wherein the non-transparent material of the capping layer comprises aluminum nitride or tape.

14. The method as claimed in claim 12, wherein the adhesive layer comprises epoxy resin, an inorganic material or an organic polymer material.

15. The method as claimed in claim 12, wherein the adhesive layer comprises silicon oxide, silicon nitride, silicon oxynitride, metal oxide, polyimide, butylcyclobutene, parylene, polynaphthalenes, fluorocarbons or acrylates.

16. The method as claimed in claim 1, wherein the adhesive layer is in direct contact with the non-transparent material and the sensing device.

17. The method as claimed in claim 12, wherein the sensing device comprises a fingerprint-recognition element, a temperature-sensing element, a humidity-sensing element or a pressure-sensing element.

18. The method as claimed in claim 12, further comprising partially removing the substrate to partially expose the conducting pad and the adhesive layer before dicing the substrate, the adhesive layer and the capping layer.

19. The method as claimed in claim 12, further comprising partially removing the substrate to simultaneously expose the conducting pad and the adhesive layer.

20. The method as claimed in claim 12, wherein the chip package has a stepped sidewall.

* * * * *